United States Patent
Shu

(10) Patent No.: US 6,503,820 B1
(45) Date of Patent: Jan. 7, 2003

(54) DIE PAD CRACK ABSORPTION SYSTEM AND METHOD FOR INTEGRATED CIRCUIT CHIP FABRICATION

(75) Inventor: William Kuang-Hua Shu, Sunnyvale, CA (US)

(73) Assignee: Koninklijke Philips Electronics N.V., Eindhoven (NL)

(*) Notice: Subject to any disclaimer, the term of this patent is extended or adjusted under 35 U.S.C. 154(b) by 0 days.

(21) Appl. No.: 09/410,942

(22) Filed: Oct. 4, 1999

(51) Int. Cl.$^7$ .............................................. H01L 21/44
(52) U.S. Cl. ....................................... 438/612; 438/617
(58) Field of Search ................................ 438/612, 617, 438/622, 624, 637, 667, 669, 671, 688; 228/179.1, 180.1, 180.21, 180.22, 180.5

(56) References Cited

U.S. PATENT DOCUMENTS

| | | | |
|---|---|---|---|
| 5,288,661 A | 2/1994 | Satoh et al. | 437/195 |
| 5,700,735 A * | 12/1997 | Shiue et al. | 438/612 |
| 5,751,065 A * | 5/1998 | Chittipeddi et al. | 257/758 |
| 5,923,088 A * | 7/1999 | Shiue et al. | 257/758 |
| 5,986,343 A * | 11/1999 | Chittipeddi et al. | 257/758 |
| 6,020,647 A * | 2/2000 | Skala et al. | 257/784 |
| 6,022,792 A * | 2/2000 | Ishii et al. | 438/612 |
| 6,022,797 A * | 2/2000 | Ogasawara et al. | 438/622 |
| 6,136,620 A * | 10/2000 | Chittipeddi et al. | 438/18 |
| 6,165,886 A * | 12/2000 | Lin et al. | 438/612 |
| 6,181,016 B1 * | 1/2001 | Lin et al. | 257/786 |
| 6,207,547 B1 * | 3/2001 | Chittipeddi et al. | 438/612 |
| 6,232,662 B1 * | 5/2001 | Saran | 257/750 |

FOREIGN PATENT DOCUMENTS

| | | | |
|---|---|---|---|
| EP | 0541405 A1 | 5/1993 | H01L/23/485 |
| EP | 0587442 A2 | 3/1994 | H01L/21/60 |
| EP | 0929099 A2 | 7/1999 | H01L/21/768 |

OTHER PUBLICATIONS

Wolf et al., Silcon Processing for the VLSI Era, vol. I –Process Technology, Lattice Press, 1986, pp. 198–199, 220–231, 395–396 and 407–513.*
Patent Abstracts of Japan vol. 016, No. 526 (E–1286), Oct. 28, 1992 —& JP 04 196552 A (Mitsubishi Electric Corp.), Jul. 16, 1992 abstract; figures 1, 2 ,5.
Patent Abstracts of Japan vol. 018, No. 556 (E–1620), Oct. 24, 1994 —& JP 06 204848 A (NEC Yamagata Ltd.) Jul. 22, 1994 abstract.
Patent Abstracts of Japan vol. 1998, No. 01, Jan. 30, 1998—& JP 09 246455 A (Hitachi Cable Ltd.), Sep. 19, 1997 abstract.
Patent Abstracts of Japan vol. 017, No. 599 (E–1455), Nov. 2, 1993—& JP 05 183007 A (NEC Corp.), Jul. 23, 1993 abstract.

* cited by examiner

Primary Examiner—John F. Niebling
Assistant Examiner—Lynne A. Gurley
(74) Attorney, Agent, or Firm—Peter Zawilski

(57) ABSTRACT

The die pad crack absorption integrated circuit chip fabrication system and method of the present invention minimizes the spread of cracks between layers of an integrated circuit chip. During an integrated circuit chip fabrication process relatively elastic material is deposited in modular elastic filler blocks located between intermetal oxide (IMO) layers of an integrated circuit chip. The modular elastic filler blocks comprise material with a lesser elastic modulous than the surrounding IMO material. These elasticity characteristics and modular configuration of the modular elastic filler blocks results in the modular elastic filler blocks being more flexible than adjacent materials and having a greater capacity to dissipate stress energy that propels cracking forces through layers of an integrated chip. By absorbing the stress energy, the modular elastic filler blocks reduce the spread of crack through the layers of an integrated chip.

9 Claims, 6 Drawing Sheets

DIE PAD CRACK ABSORPTION SYSTEM AND METHOD FOR INTEGRATED CIRCUIT CHIP FABRICATION

The present invention relates to the field of integrated circuit design and semiconductor chip fabrication. More particularly, the present invention relates to a die pad fracture propagation system and method for integrated circuit chip fabrication.

BACKGROUND OF THE INVENTION

Electronic systems and circuits have made a significant contribution towards the advancement of modem society and are utilized in a number of applications to achieve advantageous results. Electronic technologies such as digital computers, calculators, audio devices, video equipment, and telephone systems have facilitated increased productivity and reduced costs in analyzing and communicating data, ideas and trends in most areas of business, science, education and entertainment. Frequently, electronic systems designed to provide these results include integrated circuits comprising semiconductor chips.

Typically semiconductor chip fabrication includes processes in which materials of varying conductive characteristics are layered on top of one another. These layers of different materials form electrical devices and paths through which electrical signals are propagated. As with most electrical devices, it is important that the electrical signals follow certain paths in order for theses semiconductor chips to operate correctly. Otherwise detrimental short circuits or other problems may arise. For example, most semiconductor chips have specific vias for electrical signals to travel between layers and electrical signals propagating between layers outside these vias result in short circuits preventing the semiconductor chip from operating correctly.

FIG. 1 is an illustration of a prior art semiconductor chip 100. Semiconductor chip 100 comprises substrate layer 105, a first metal layer 110, intermetal oxide (IMO) layer 115, a second metal layer 120, IMO layer 125, a third metal layer 130, passivation 107 and vias 191, 192 and 193. First metal layer 110 is coupled to substrate layer 105 and IMO layer 115 which is coupled to second metal layer 120. Third metal layer 130 is coupled to bonding ball 103, passivation 107 and IMO layer 125 which is coupled to second metal layer 120. Bonding ball 103 is coupled to wire 101 and passivation 107. In one example of semiconductor chip 100 substrate layer 105 comprises silicon (Si) and metal layers 110, 120 and 130 comprise aluminum (Al). Vias 191 and 192 are coupled to first metal layer 110 and second metal layer 120. Via 193 is coupled to second metal layer 120 and third metal layer 130.

The varying material in the different layers of semiconductor chip 100 are used to form electrical devices. For example the varying configurations of conductive material laid down in first metal layer 110, second metal layer 120 and third metal layer 130 are laid down in patterns that form transistor switches. Vias 191 and 192 provide appropriate and planned conductive paths between first metal layer 110 and second metal layer 120. Via 193 provides an appropriate and planned conductive path between second metal layer 120 and third metal layer 130. However, semiconductor chip 100 does not operate properly because fracture or crack 198 permits electrical signals to travel between the layers of semiconductor chip 100.

Crack 198 in semiconductor chip 100 occurred during the coupling of bonding ball 103 and wire 101 to third metal layer 130. Third metal layer 103 acts as a bond pad for wire 101 which is electrically coupled and attached by bonding ball 103. Bonding ball 103 is applied to third metal layer 103 and wire 101 by a wire bond process (e.g., thermal bonding, thermal sonic bonding, ultrasonic bonding, etc.). In a wire bond process the bonding ball 103 is actually formed from the wire (e.g., a gold wire) as it is extruded from a capillary tube. An electrical arch is applied to a portion of the wire as it is extruded and a ball of the wire material is created on the end of the wire. The ultrasonic waves are directed at the bonding ball which cause it to bond wire 103 to third metal layer 101. These ultra sonic waves also cause stresses in the layers of semiconductor chip 100 which result in the inappropriate and unplanned cracks or fractures.

What is required is a fabrication system and method that minimizes the spread of cracks between layers of an integrated circuit chip. The system and method should reduce the propagation of inappropriate cracks that occur between layers of a integrated circuit chip as a result of stress energy. For example the system and method should reduce the extension of fractures from one layer to another layer caused during ultrasonic bonding of a wire to bond pads of an integrated circuit chip.

SUMMARY OF THE INVENTION

The system and method of the present invention minimizes the spread of cracks between layers of an integrated circuit chip. The system and method of the present invention reduces the propagation of inappropriate cracks that occur between layers of a integrated circuit chip as a result of stress energy. The tendency of fractures caused during ultrasonic bonding of a wire to bond pads of the semiconductor chip to extend from one layer to another layer is reduced by the present invention. The present invention also permits denser bond pad packing and effectively increases die yields per wafer.

In one embodiment of the present invention a die pad crack absorption integrated circuit chip fabrication process enables a modulous stress absorbing filler layer to be included in a semiconductor chip. The modulous stress absorbing filler layer is included in the chip in a manner that reduces the spread of cracks or fractures between layers of electrically active regions in and on an integrated circuit chip. The modulous stress absorbing filler layer includes material with more enhanced elastic characteristics than the surrounding IMO layer material. The discontiguous modular elastic material absorbs energy associated with stresses applied to the integrated circuit chip thereby reducing the dissemination of fractures between layers of a die pad crack absorption integrated circuit chip.

DETAILED DESCRIPTION OF THE INVENTION

Reference will now be made in detail to the preferred embodiments of the invention, a system and method for maintaining time dependencies, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one ordinarily skilled in the art that the present invention may be practiced without these specific details. In other instances, well known methods, procedures, components, and circuits have not been described in detail as not to unnecessarily obscure aspects of the current invention.

The system and method of the present invention provides a layer of modulous elastic filler in a integrated circuit chip. The material comprising the modulous elastic filler has a relatively lower elasticity modulous than the materials that form adjacent intermediate oxide layers. The relatively flexible elastic characteristics of the modulous elastic filler material enables it to absorb energy associated with stresses applied to a chip and thereby reduce the propagation of cracks or fractures between the layers of a chip.

Figure 1:
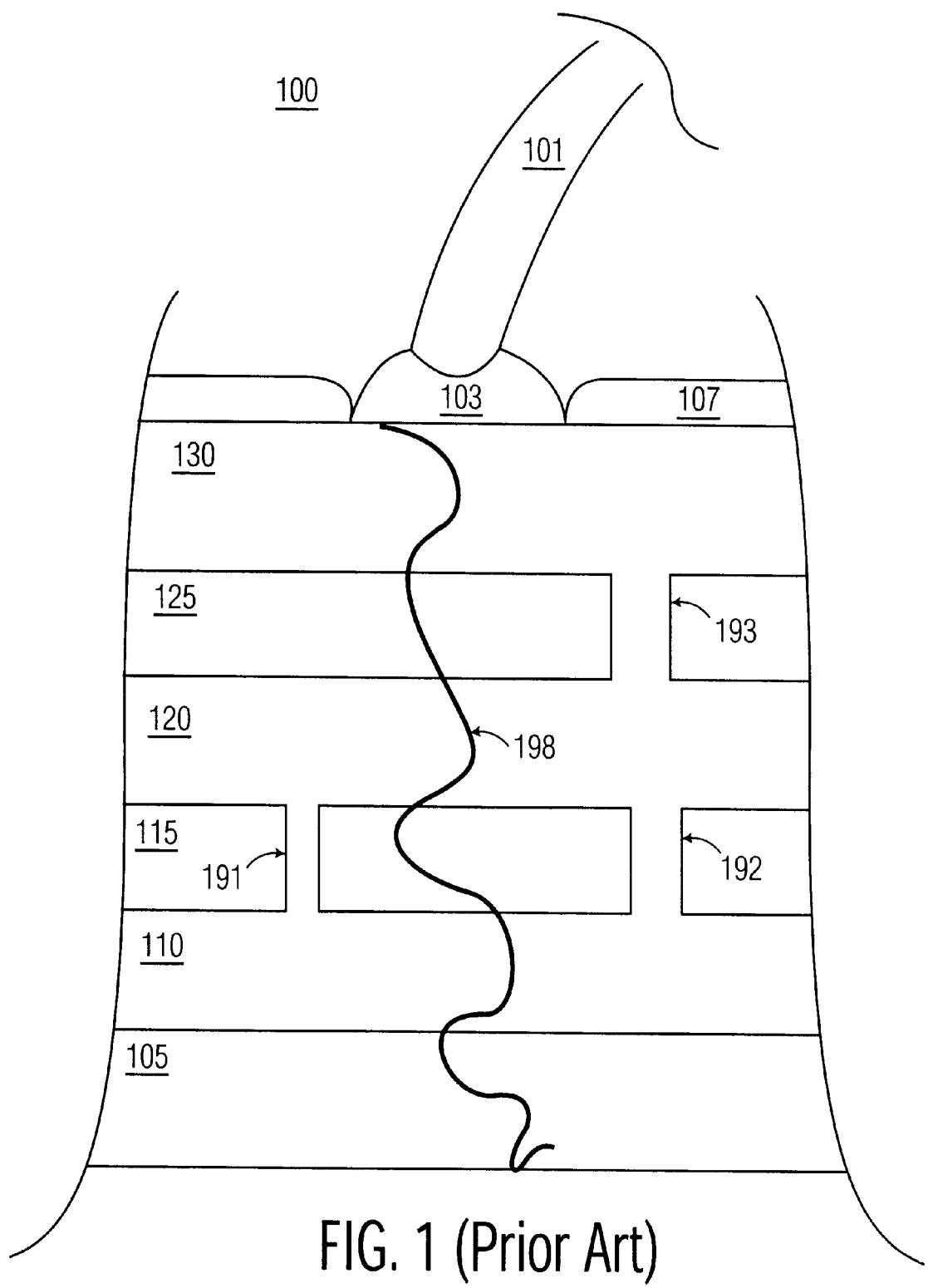
FIG. 1 is an illustration of a prior art semiconductor chip.
Figure 2A:
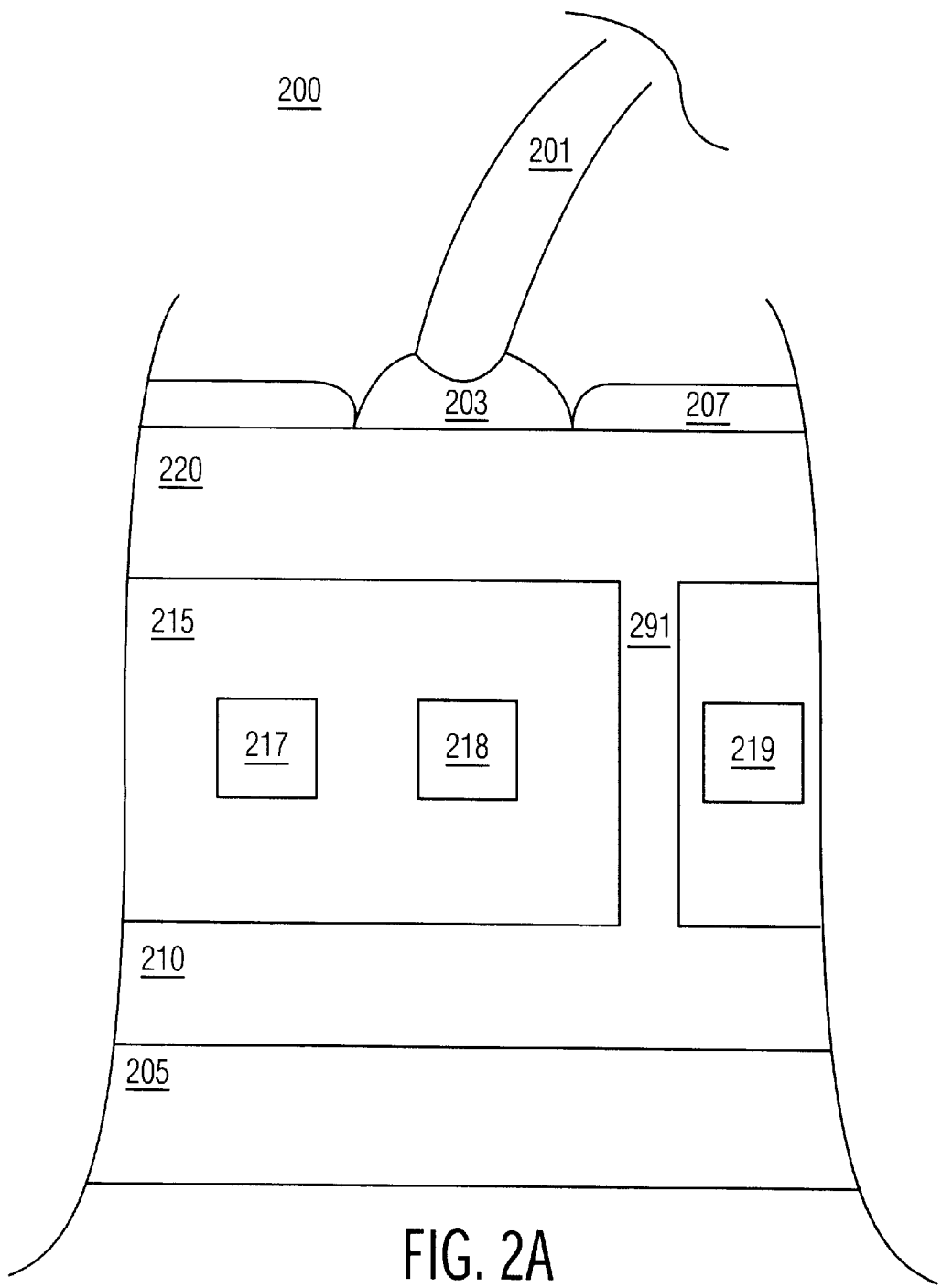
FIG. 2A is an illustration of one embodiment of a die pad crack absorption integrated circuit chip of the present invention.

FIG. 2A is an illustration of die pad crack absorption integrated circuit chip 200, one embodiment of the present invention. Die pad crack absorption integrated circuit chip 200 comprises substrate layer 205, a first metal layer 210, IMO layer 215, modular elastic filler block 217, modular elastic filler block 218, modular elastic filler block 219, a third metal layer 220, passivation 207 and via 291. First metal layer 210 is coupled to substrate layer 205 and intermetal oxide IMO layer 215 which is coupled to third metal layer 220. Third metal layer 220 is coupled to bonding ball 203, passivation 207. Bonding ball 203 is coupled to wire 201 and passivation 207. In one example of semiconductor chip 200 substrate layer 205 comprises silicon (Si) and metal layers 210, and 220 comprise aluminum (Al). Via 291 is coupled to metal layer 220 and metal layer 210.

Die pad crack absorption integrated circuit chip 200 is a semiconductor chip that performs various operations in an electrical system. The IMO layer 215 forms electrical devices such as transistor switches. Metal layers 210 and 220 provide conductive paths for transmission of electrical signals between the electrical devices in a IMO layer. Vias 291 provides an appropriate and planned conductive paths between first metal layer 210 and third metal layer 220. Modular elastic filler block 217, 218 and 219 absorb energy associated with stresses applied to the chip thereby reducing the spread of cracks between layers.

Modular elastic filler block 217, 218 and 219 comprise material with a lesser elastic modulous than the surrounding IMO material. These elasticity characteristics and modular configuration of the modular elastic filler blocks result in the modular elastic filler blocks being more flexible than adjacent materials and having a greater capacity to dissipate stress energy that propels cracking forces through layers of an integrated chip. For example, in one embodiment of the present invention the modular elastic filler blocks include aluminum. Embodiments in which metals are included in materials comprising modular elastic filler blocks may pose layer nomenclature confusion. For example, in an embodiment in which modular elastic filler blocks. 217, 218 and 219 include a metal they technically form a second metal layer according to some nomenclature conventions. In order to avoid confusion, modular elastic filler blocks 217, 218 and 219 are referred to herein as forming a modular elastic filler layer. It should be appreciated that a variety of materials are utilized in different embodiments of the present invention to form modular elastic filler blocks.

In one embodiment of the present invention the modular elastic filler blocks are arranged in a manner that maximizes the resistance to cracks propagating between layers. In one embodiment of elastic filler semiconductor chip 200 the modular elastic filler blocks are not so densely configured so as to prevent adequate dissipation of stress energy or to adversely affect structural integrity of the chip. Nor are the modular elastic filler blocks so sparsely located as to miss intercepting a propagation of a crack through the IMO layer.

Figure 2B:
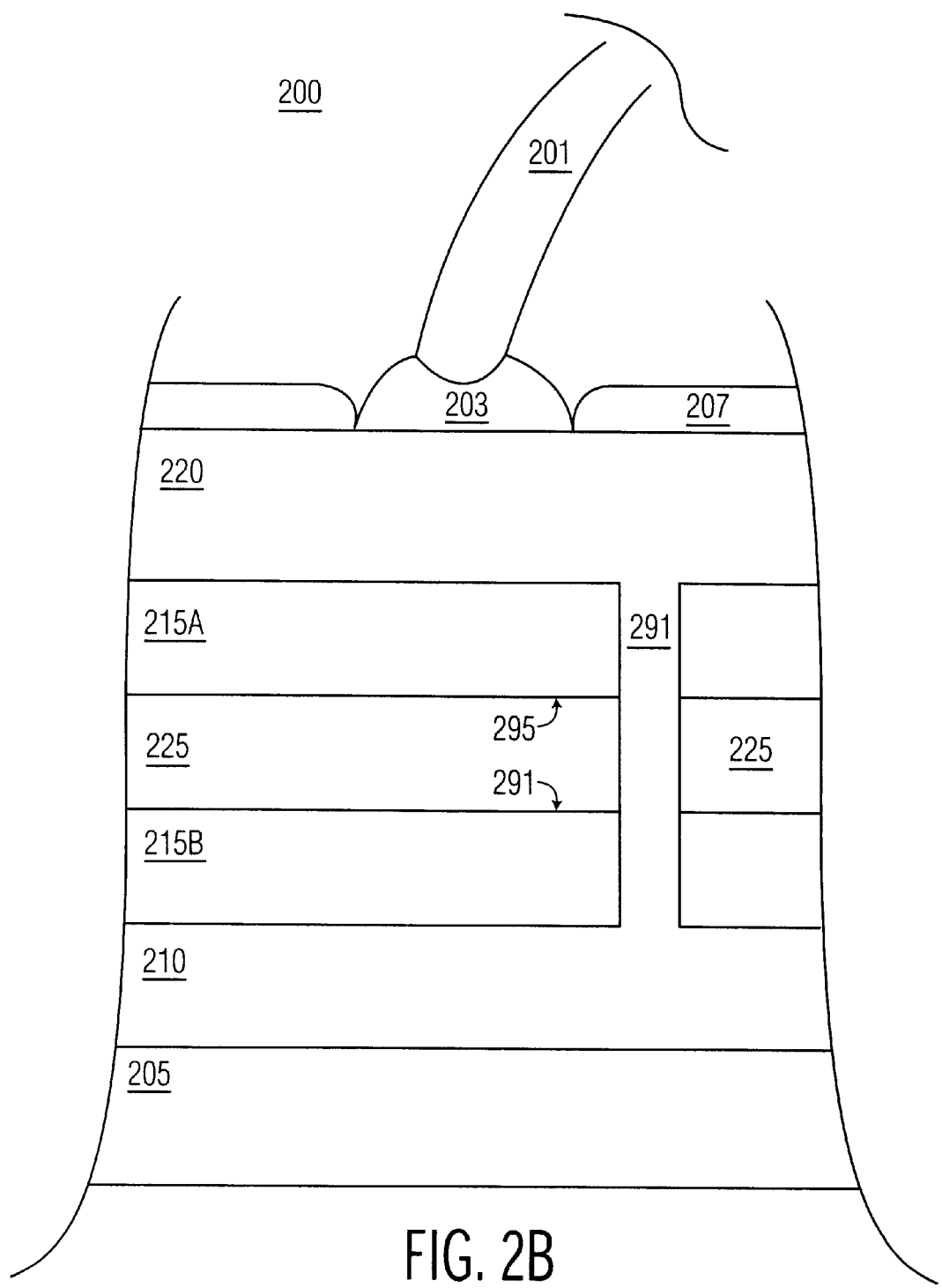
FIG. 2B is an illustration of one embodiment of die pad crack absorption integrated circuit chip in which a single modular elastic filler block forms an elastic filler layer between IMO layers.

It should be appreciated that the modular elastic filler blocks comprise a variety of sizes. FIG. 2B is an illustration of one embodiment of die pad crack absorption integrated circuit chip 200 in which a single modular elastic filler block forms an elastic filler layer between IMO layers (e.g., 215A and 215B). In one embodiment of the present invention the elastic filler layer has holes occupied by via material (e.g., via 291) therein from an upper surface (e.g., upper surface 295) of the elastic filler to the lower surface (e.g., lower surface 296) of the elastic filler. In one embodiment of die pad crack absorption integrated circuit chip 200 the elastic filler layer is formed by a layer of material (e.g., aluminum) that is electrically floating or isolated from an input/output (I/O) buffer circuit. In one embodiment of the present invention the elastic filler layer comprises a compressable material and dissipates stress forces associated with a wire bond process.

Figure 3A:
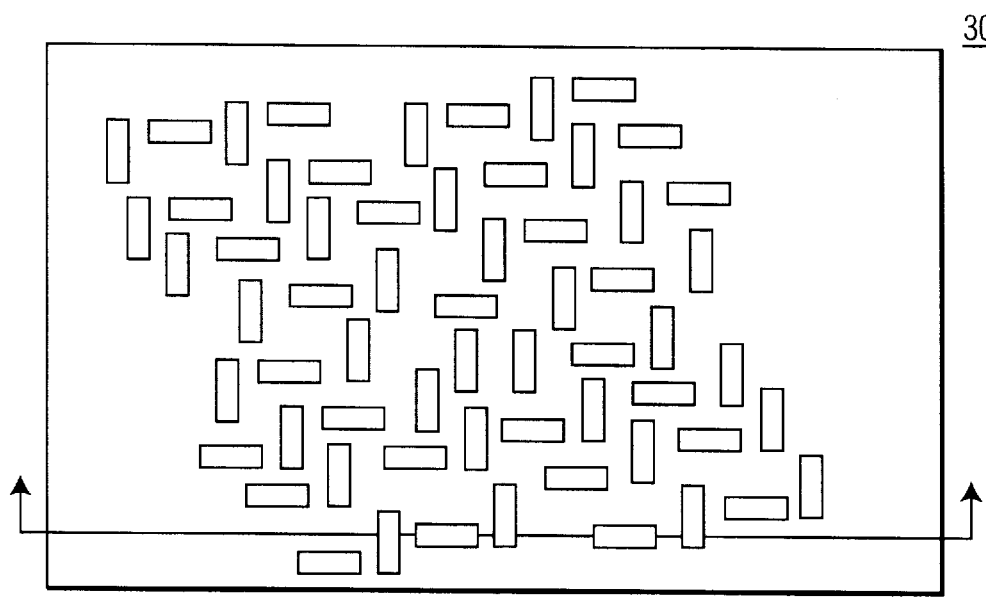
FIG. 3A is top view illustrating a configuration of modular elastic filler blocks in one embodiment of the present invention.
Figure 3B:
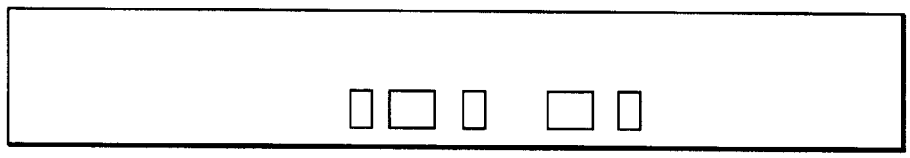
FIG. 3B is side view illustrating a configuration of modular elastic filler blocks in one embodiment of the present invention.
Figure 3C:
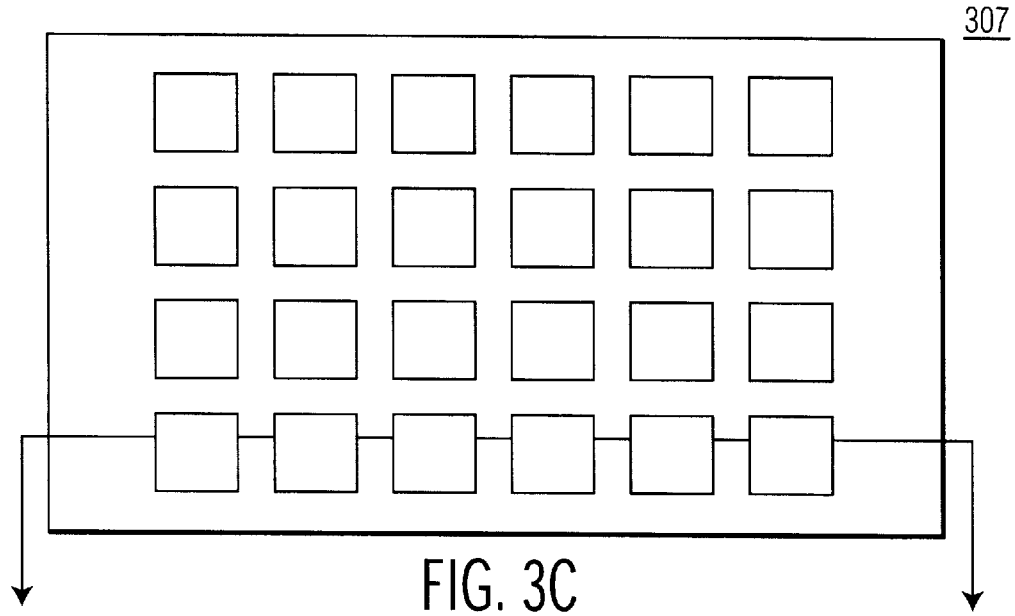
FIG. 3C is a top view of an example of a modular elastic filler block configuration in which the top of the elastic filler block is square.
Figure 3D:
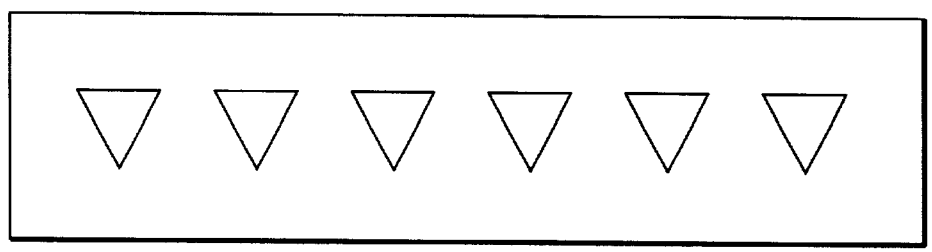
FIG. 3D is a side view of an example of a modular elastic filler block configuration in which the side of the elastic filler block is triangular.
Figure 3E:
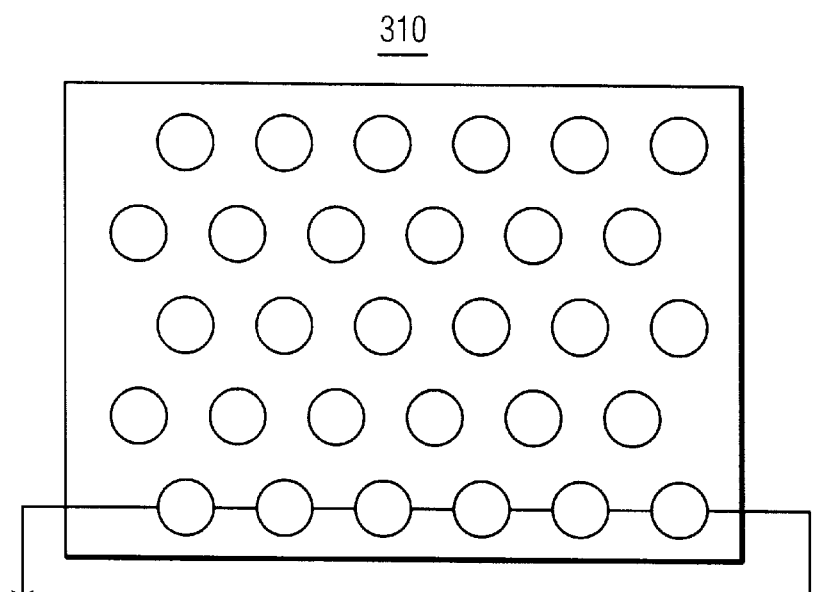
FIG. 3E is a top view of an elastic filler block configuration in which the modular elastic filler blocks have rounded edges permitting even greater energy absorption than sharp edged modular elastic filler blocks.
Figure 3F:
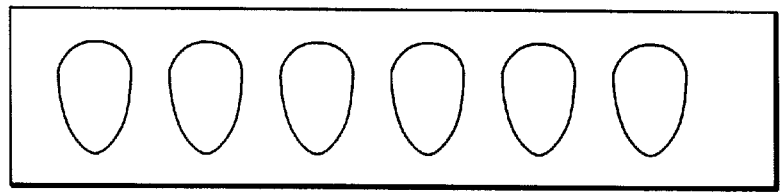
FIG. 3F is a side view of an elastic filler block configuration which the modular elastic filler blocks have rounded edges permitting even greater energy absorption than sharp edged modular elastic filler blocks.

It should also be appreciated that the modular elastic filler blocks are arranged in a variety of patterns and configurations. In one embodiment the modular elastic filler blocks are arranged in configuration 305 illustrated in FIG. 3A top view and FIG. 3B side view. FIG. 3C is a top view and FIG. 3D is a side view (respectively) of another example of a modular elastic filler block configuration 307. FIG. 3E is a top view and FIG. 3F is a side view of elastic filler block configuration 310, an embodiment of the present invention in which the modular elastic filler blocks have rounded edges permitting even greater energy absorption than sharp edged modular elastic filler blocks.

Figure 4:
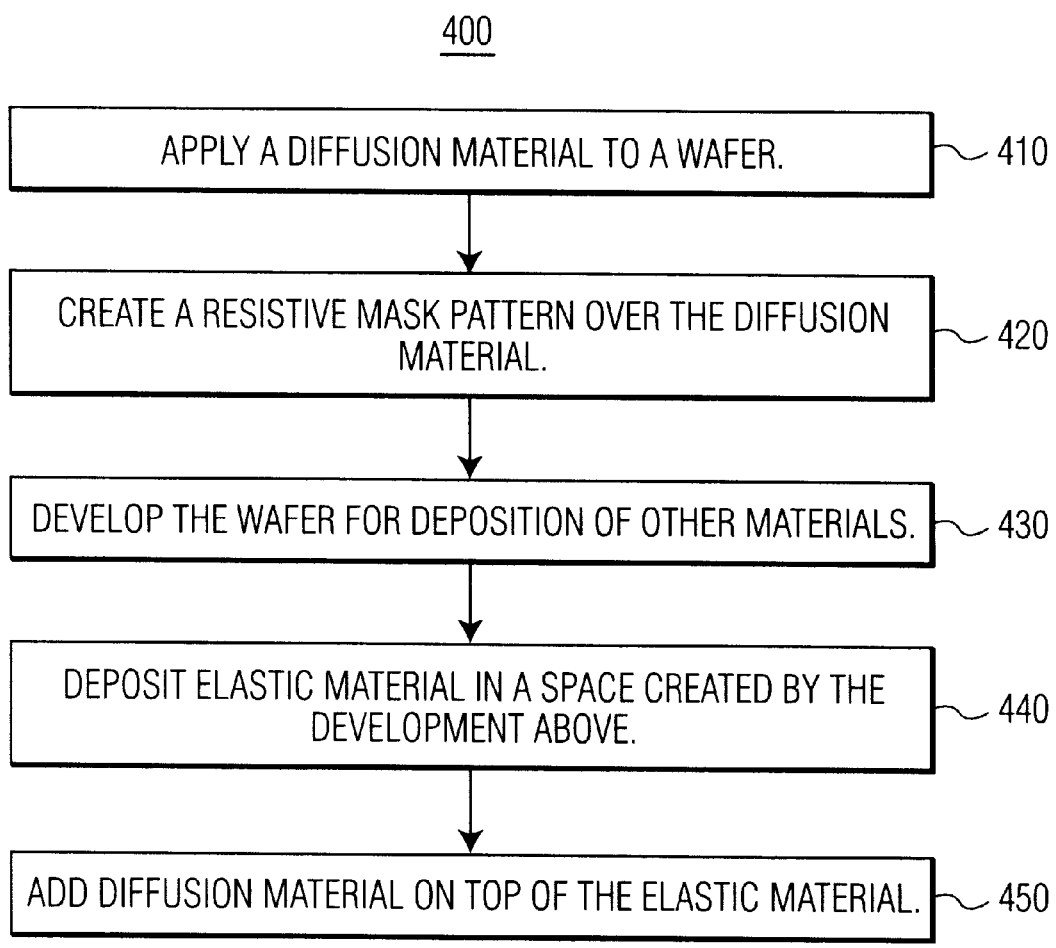
FIG. 4 is a flow chart of a die pad crack absorption integrated circuit chip fabrication process comprising one embodiment of the present invention.

FIG. 4 is a flow chart of die pad crack absorption integrated circuit chip fabrication process 400, one embodiment of the present invention. Die pad crack absorption integrated circuit chip fabrication process 400 enables a modulous stress absorbing filler layer to be included in a semiconductor chip. The modulous stress absorbing filler layer is included in the chip in a manner that prevents cracks or fractures from propagating between layers of electrically active regions in and on the semiconductor chip.

A diffusion material is applied to a wafer in Step 410. For example, thermal oxidation or deposition is utilized in step 410 to form silicon dioxide. In one embodiment of die pad crack absorption integrated circuit chip fabrication process 400 the wafer is heated and exposed to ultra-pure oxygen in a diffusion furnace under carefully controlled conditions forming a silicon dioxide film of uniform thickness on the surface of the wafer. The wafer is pre-cleaned before the diffusion process begins using high purity, low particle chemicals.

In Step 420 a resistive mask pattern is created over the diffusion material. In one embodiment the diffusion material is coated with a layer of resist material. The resist material is used to mask or protect one area of the wafer while working on another. In one embodiment the mask is imprinted utilizing a lithography. For example, in a or photomasking process a photo resist or light-sensitive film is applied to the wafer, giving it characteristics similar to a piece of photographic paper. A photo aligner aligns the wafer to a mask and then projects an intense light through the mask and through a series of reducing lenses, thereby exposing the photo resist to light according to the mask pattern. The portions of the resist exposed to light becomes soft or hard depending on the photo resist used. In another embodiment an X-ray lithography process is used.

In Step 430 the wafer is then "developed" for deposition of other materials. In one embodiment the wafer is developed by removing the softer exposed photo resist and baking the wafer to harden the remaining photo resist pattern. The areas of the diffusion material not covered by the hardened photo resist are etched away. In one embodiment the etching is accomplished by exposing the photo resist to a chemical solution or plasma (gas discharge) so the non hardened photo resist is removed. The wafer is inspected to ensure the image transfer from the mask to the top layer is correct.

In Step 440 an elastic material is deposited in a space created in the diffusion material by the development above. In one embodiment of the present invention die pad crack absorption integrated circuit chip fabrication process 400 the elastic material is spread over the top to the remaining diffusion material and photo resist in a manner that causes the elastic material to fill the developed areas. After the developed areas are full of elastic material, excess elastic material on top is removed.

In Step 450 diffusion material is added on top of the elastic material. The diffusion material added on top of the elastic material serves as the next IMO layer. In one embodiment of die pad crack absorption integrated circuit chip fabrication process 400 other integrated electrical circuit components are included in the diffusion material added to the top of the elastic material. For example, integrated electrical circuit elements are added through a process of masking, etching and doping of the diffusion material with additional chemicals.

The die pad crack absorption integrated circuit chip system and method of the present invention facilitates greater density in bond pad packing and die yields off a single wafer. By deterring the spread of cracks propelled by stress energy caused during activities such as ultra sonic bond pad soldering, a die pad crack absorption integrated circuit chip is capable of withstanding stresses caused by attaching wires to bond pads configured in close proximity to one another. By reducing the threat of significant cracking problems when wires are attached to bond pads in close proximity to one another, bond pads can be moved relatively close together and enable die size reduction. Furthermore, reduced die sizes enables more dies to be manufactured on a single wafer, increasing the yield of dies per wafer.

Thus, the system and method of the present invention minimizes the spread of cracks between layers of an integrated circuit chip. The die pad crack absorption integrated circuit chip system and method of the present invention reduces the propagation of inappropriate cracks that occur between layers of an integrated circuit chip as a result of stress energy. The tendency of fractures caused during ultrasonic soldering of a wire to bond pads of the semiconductor chip to extend from one layer to another layer is reduced by the present invention. The present invention also permits denser bond pad packing and effectively increases die yields per wafer.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A die pad crack absorption integrated circuit chip fabrication process, comprising the steps of:

a) applying a insulating material to a wafer;

b) creating a resistive mask pattern over said insulating material;

c) developing said insulating material for deposition of other materials; and d) depositing an elastic material in a space produced by said developing of said insulating material.

2. The die pad crack absorption integrated circuit chip fabrication process of claim 1 in which thermal oxidation is utilized in step a) to form silicon dioxide.

3. The die pad crack absorption integrated circuit chip fabrication process of claim 1 in which step a) further comprises the steps of:

heating said wafer in a furnace;

exposing said wafer to ultra-pure oxygen under carefully controlled conditions adapted to form a silicon dioxide film of uniform thickness on the surface of said wafer; and pre-cleaning said wafer using high purity, low particle chemicals.

4. The die pad crack absorption integrated circuit chip fabrication process of claim 1 in which step b) further comprises the steps of:

coating said insulating material with a resist material; and utilizing lithography to imprint a mask pattern on said resist material.

5. The die pad crack absorption integrated circuit chip fabrication process of claim 4 further comprising the steps of:
- applying a photo resist or light-sensitive film to said wafer;
- aligning said wafer to said mask;
- projecting an intense light through said mask and through a series of reducing lenses; and
- exposing said photo resist to light according to a pattern of said mask.

6. The die pad crack absorption integrated circuit chip fabrication process of claim 4 in which said lithography includes X-ray lithography.

7. The die pad crack absorption integrated circuit chip fabrication process of claim 4 in which said resist material is adapted to mask or protect one area of said wafer while working on another.

8. The die pad crack absorption integrated circuit chip fabrication process of claim 1 in which step c) further comprises the steps of:
- removing a softer exposed photo resist; and
- baking the wafer to harden a remaining photo resist pattern.

9. The die pad crack absorption integrated circuit chip fabrication process of claim 1 in which step d) further comprises the steps of:
- spreading said elastic material over the top to remaining insulating and photo resist material in a manner that causes said elastic material to fill developed areas; and
- removing excess elastic material after said developed areas are full of elastic material.

* * * * *